United States Patent [19]
Rust

[11] Patent Number: 5,745,608
[45] Date of Patent: Apr. 28, 1998

[54] STORING DATA COMPRESSED WITH ARITHMETIC CODING IN NON-CONTIGUOUS MEMORY

[75] Inventor: Robert A. Rust, Boise, Id.

[73] Assignee: Hewlett-Packard Company, Palo Alto, Calif.

[21] Appl. No.: 647,860

[22] Filed: May 15, 1996

Related U.S. Application Data

[63] Continuation-in-part of Ser. No. 293,229, Aug. 19, 1994, Pat. No. 5,574,953.

[51] Int. Cl.⁶ .................... G06K 9/36; G06K 9/46
[52] U.S. Cl. .......................... 382/247; 382/305
[58] Field of Search ..................... 382/247, 233, 382/305; 358/426, 261.4; 395/497.01, 497.02, 888; 364/715.02

[56] References Cited

U.S. PATENT DOCUMENTS 5,555,323  9/1996  Hongu ............................ 382/247
5,574,953  11/1996  Rust et al. ........................ 395/888

*Primary Examiner*—Leo Boudreau
*Assistant Examiner*—Phuoc Tran
*Attorney, Agent, or Firm*—Anthony J. Baca

[57] ABSTRACT

A arithmetic coding data compression and decompression method for storing compressed data in non-contiguous memory. As the data is compressed and stored in memory, any non-contiguous segments are properly marked. Such marking requires that the last location contains a pointer to the next memory location used. Just prior to the pointer a special "LINK" sequence is stored. Thus, when the compressor completes its job, the non-contiguous memory is logically linked together. During decompression, if the decompressor encounters an illegal sequence, the decompressor must determine if this is an error condition or an indication that an address follows. If the illegal sequence is "LINK" the next location contains a pointer to the remaining compressed data. If that pointer is zero, then all the compressed data has been processed. If the address is non-zero, the decompressor jumps to the new address and continues de-compressing.

10 Claims, 4 Drawing Sheets

STORING DATA COMPRESSED WITH ARITHMETIC CODING IN NON-CONTIGUOUS MEMORY

REFERENCE TO RELATED APPLICATIONS

This is a continuation-in-part of U.S. patent application Ser. No. 08/293,229, filed Aug. 19, 1994, which issued as U.S. Pat. No. 5,574,953, on Nov. 12, 1996.

TECHNICAL FIELD

The present invention relates to data compression and more particularly, to an arrangement that allows for the storage of arithmetic coding compressed data in non-contiguous memory.

BACKGROUND OF THE INVENTION

Data compression systems are known in the prior art that encode a stream of digital data signals into compressed digital code signals and decode the compressed digital code signals back into the original data. Data compression refers to any process that attempts to convert data in a given format into an alternative format requiring less space than the original. The objective of data compression systems is to effect a savings in the amount of storage required to hold or the amount of time required to transmit a given body of digital information.

To be of practical utility, a general purpose digital data compression system should satisfy certain criteria. The system should have reciprocity. In order for a data compression system to possess the property of reciprocity it must be possible to re-expand or decode the compressed data back into its original form without any alteration or loss of information. The decoded and original data must be identical and indistinguishable with respect to each other. The property of reciprocity is synonymous to that of strict noiselessness used in information theory. Some applications do not require strict adherence to the property of reciprocity. One such application in particular is when dealing with graphical data. Because the human eye is not that sensitive to noise, some alteration or loss of information during the compression de-compression process is acceptable.

The system should provide sufficient performance with respect to the data rates provided by and accepted by the devices with which the data compression and de-compression systems are communicating. The rate at which data can be compressed is determined by the input data processing rate into the compression system, typically in millions of bytes per second (megabytes/sec). Sufficient performance is necessary to maintain the data rates achieved in present day disk, tape and communication systems which rates typically exceed one megabyte/sec. Thus, the data compression and de-compression system must have enough data band-widths so as to not adversely affect the overall system. The performance of data compression and de-compression systems is typically limited by the computations necessary to compress and de-compress and the speed of the system components such as, random access memory (RAM), and the like, utilized to store statistical data and guide the compression and de-compression process. Performance for a compression device is characterized by the number of cycles required per input character under the compressor. The fewer the number of cycles, the higher the performance.

Another important criteria in the design of data compression and de-compression systems is compression effectiveness, which is characterized by the compression ratio. The compression ratio is the ratio of data size in uncompressed form divided by the size in compressed form. In order for data to be compressible, the data must contain redundancy. Compression effectiveness is determined by how effectively the compression procedure uses the redundancy in the input data. In typical computer stored data, redundancy occurs both in the nonuniform usage of individual symbology, example digits, bytes, or characters, and in frequent recurrence of symbol sequences, such as common words, blank record fields and the like.

General purpose data compression procedures are known in the prior art, three relevant procedures being the Huffman method, the Tunstall method and the Lempel-Ziv method. The Huffman method is widely known and used, reference thereto in article of D. A. Huffman entitled "A Method For Construction Of Minimum Redundancy Codes", Proceedings IRE, 40, 10 pages 1098–1100 (September 1952). Reference to the Tunstall algorithm may be found in Doctoral thesis of B. P. Tunstall entitled "Synthesis of Noiseless Compression Codes", Georgia Institute of Technology (September 1967). Reference may be had to the Lempel-Ziv procedure in a paper authored by J. Ziv and A. Lempel entitled "A Universal Algorithm For Sequential Data Compression", IEEE Transactions on Information Theory, IT-23, 3, pages 337–343 (May, 1977).

One of the first general purpose data compression procedures developed is the Huffman method. Briefly described, the Huffman procedure maps full length segments of symbols into variable length words. The Huffman data compression procedure suffers from two limitations. Firstly, the Huffman procedure operates under the constraint that the input data to be compressed be parsed into fixed length segments of symbols. Although the Huffman procedure provides the best compression ratio that can be obtained under these constraints, when the constraint is relaxed it is possible to obtain significantly better compression ratios by utilizing other procedures. Secondly, Huffman coding requires full knowledge of the statistical characteristic of the source data. The Huffman procedure operates under the assumption that the probability with which each fixed length input segment occurs is known. This requirement of the Huffman procedure can in practice, be satisfied by the use of an adaptive version of the procedure which accumulates the necessary statistics during processing of the data. This, however, is cumbersome, and requires considerable working memory space and performs sub-optimally during adaptation.

The Tunstall algorithm, which maps variable length segments of symbols into fixed length binary words, is complementary to the Huffman procedure with the fixed length constraints now applied to the output segments instead of the input segments. Like the Huffman procedure, the Tunstall procedure requires a foreknowledge of the source data probabilities. Again this foreknowledge requirement can be satisfied to some degree by utilizing an adaptive version that accumulates the statistics during processing of the data.

The Lempel-Ziv procedure maps variable length segments of the symbols into variable length binary words. It is asymptotically optimal when there are no constraints on the input or output segments. In this procedure the input data string is parsed into adaptively grown segments, each segment consisting of an exact copy of an earlier portion of the input string suffixed by one new symbol from the input data. The copy which is to be made is the longest possible and is not constrained to coincide with any earlier parsed segment. The code word which replaces the segment in the output contains information consisting of a pointer to where there earlier copied portion begins, the length of the copy, and the new symbol.

It would appear that Huffman or Shannon-Fano coding is the perfect means of compressing data. However, this is not the case. As mentioned above, these coding methods are optimal when and only when the symbol probabilities are integral powers of ½, which is usually not the case.

The technique of arithmetic coding does not have this restriction: It achieves the same effect as treating the message as one single unit (a technique which would, for Huffman coding, require enumeration of every single possible message), and thus attains the theoretical entropy bound to compression efficiency for any source.

In arithmetic coding, one decision after another is encoded to define successfully smaller, lesser included intervals along a number line. Additional information on arithmetic coding can be found in "An Introduction To Arithmetic Encoding"; by G. G. Langdon, Jr., IBM Journal of Research and Development, Vol. 28, n. 2, March 1984, 135–149; and "Arithmetic Compression Code Control Parameters Approximation"; by D. R. Helman, G. G. Langdon, Jr., and J. J. Rissanen, Vol. 23, n. 11, April 1981, 5112–5114 and U.S. Pat. No. 4,905,297, "Arithmetic Coding Encoder And Decoder System", Langdon, Jr. et al. all incorporated herein by reference.

As noted in the above articles, arithmetic coding provides that each decision has a plurality of possible exclusive outcomes "or events". Each outcome or event is represented in data by a symbol. In the imaging environment, for example, each decision may correspond to whether or not a given pixel is black. The decision outcome being represented by a Y (or YES) symbol if the pixel is black or an N (or NO) symbol if the pixel is not black. Thus, a plurality of decisions may then be represented by a sequence of symbols, e.g., YNNY . . . .

In accordance with prior arithmetic coding teachings, a probability line has a current interval defined thereon. The first current interval is 0 to 1. The current interval is divided into segments in which segment corresponds to one possible outcome for the next decision. Where there are only two possible outcomes for each decision, the current interval is divided into two segments. The length of each segment is based on its respective associated probability. The respective probabilities may remain fixed or may adapt as decision data is entered.

It is the correlating of large segments to symbols which occur with greater frequency that leads to the compression effect. In the former cited article ("An Introduction To Arithmetic Encoding"), a 4-symbol arithmetic coding example is set forth in which each decision can result in an "a" event (having a 50% probability), a "b" event (having a 25% probability), a "c" event (having a 12.5% probability), or a "d" event (having a 12.5% probability). Representing the four events in binary form would require two bits for each decision, where the events would be represented respectively by 00, 01, 10, 11. For three decisions such as "aab" which is highly likely, the straight forward encoding data would be 00 00 01; requiring six bits. However, as observed in the article at page 137, the arithmetic coding approach permits the sequence "aab" to be represented by the value 0.001. Instead of six bits, the information can be represented in three bits. This conservation of bits results as successive events having relatively high associated probabilities occur.

The conservation deteriorates if numerous events occur for which there are low probabilities and relatively short line segments. With the above noted probabilities, a sequence of events "dd" would be represented with encoded data as 11 11 whereas, by arithmetic coding, the "dd" events would be represented by 111111. Provided that the larger segments in fact correspond to events that occur with correspondingly greater frequency, the additional bits needed for less probable symbols are outweighed by the conservation achieved when more probable symbols occur.

To help keep cost reasonably, data compression is used in the art of page printers such as electrophotography. For example, a 600 dot per inch (DPI) page is about 4 MB in size. By using a compression technique, this can be reduced to about 1 MB. The art of electrophotography printing places a performance constraint for the decompression process. In particular, the compressed data must be decorepressed fast enough to provide a constant stream of data to the print engine. To insure that this performance requirement is met, the decompression task is performed by hardware.

When managing memory, the memory can become fragmented due to numerous small pieces of data being stored and then removed. As memory becomes more fragmented, only smaller sized blocks of memory are available to store compressed images. Because the hardware decompressor walks through memory, prior to the present invention, the compressed data must reside in contiguous memory. However, it may not always be possible to find 1 MB of contiguous memory since memory tends to become fragmented over time.

If the compression scheme uses special codes, it is possible to define a new code that indicates directs the decompressor through memory. In, *Storing Compressed Data in Non-Contiguous Memory*, filed: Aug. 19, 1994 Ser. No. 08/293,229 which issued as U.S. Pat. No. 5,574,953, on Nov. 12, 1996, incorporated herein by reference. However, arithmetic coding compression scheme does not use discrete codes, therefore defining a special "LINK" code is not possible.

One issue that arises in arithmetic code generation is the rippling effect of a carry out. In typical applications, this is solved by adding a stuff bit to the stream to catch any carry out overflow. This has the effect of reducing the number of consecutive ones in the output data stream. A stuff bit is added after 8 to 15 ones occur in a row. Thus, two xFFs in a row indicates an error.

SUMMARY OF THE INVENTION

In order to accomplish the present invention, there is provided a data compression and decompression method for storing the compressed data in non-contiguous memory. Several embodiments are possible to create the compressed the data. However, basically as the data is compressed and stored in memory, any non-contiguous segments must be properly marked. Such marking requires that the last location contains a pointer to the next memory location used. Just prior to the pointer the special "LINK" sequence is stored. Thus, when the compressor completes its job, the non-contiguous memory is logically linked together.

This linking process can be accomplished "on the fly" as just described or, all the linking may be performed prior to starting the compression process. With this approach, a memory management unit or the like appropriates the necessary memory. Next, at each discontinuity the appropriate "LINK" sequence and pointer are stored. Once the memory has been linked, the compressor follows the links as it stores the compressed data.

To decompress the compressed data, first a code of the compressed data is retrieved from the non-contiguous memory. If the code is a link code, then an address pointer to the next location in memory where the next compressed data is stored is retrieved from memory. If, in the alternative, the code in not a link code then the code is decompressed.

BRIEF DESCRIPTION OF THE DRAWINGS

A better understanding of the invention may be had from the consideration of the following detailed description of the preferred embodiment taken in conjunction with the accompanying drawings in which.

DETAILED DESCRIPTION OF THE INVENTION

As stated above, when using arithmetic coding the concept of individual code is not present. With the understanding that under arithmetic coding, two xFFs in a row indicates an error, the present invention uses two consecutive xFF bytes (herein referred to as "LINK" sequence ) to indicate that an address follows indicating where the next block of compressed data is stored.

Figure 1:
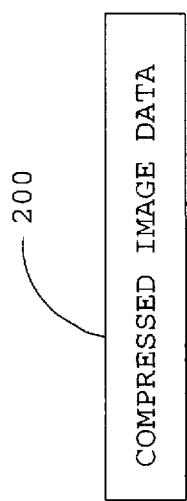
FIG. 1 attempts to visualize how a compressed image data would look stored in contiguous memory.

Prior to the present invention, if the decompressor was implemented in hardware, the compressed image must be stored in contiguous memory. Visualizing this requirement might look like FIG. 1. Here the "COMPRESSED IMAGE DATA" resides in a single memory block 200. The decompressor was programmed to retrieve a pre-defined number amount of data because no special EOD code was possible.

Figure 2:
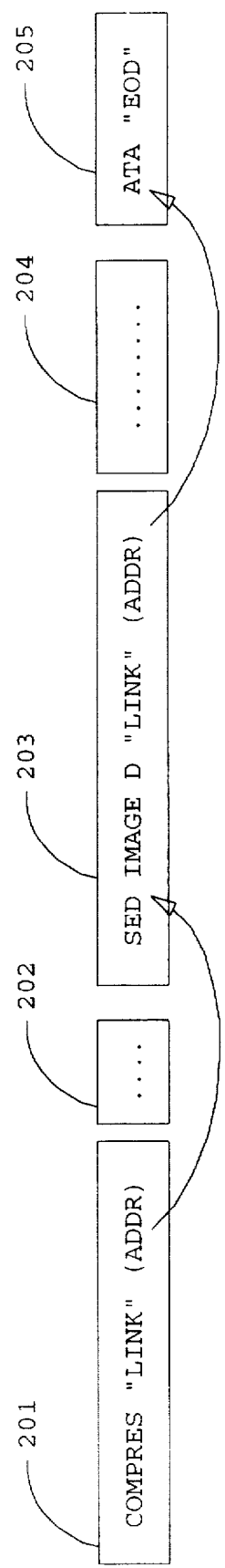
FIG. 2 visualizes how a compressed image data would look stored in non-contiguous memory using the present invention.

Storing the compressed image data in contiguous memory produces the most compact compressed data. However, fragmentation of memory may preclude finding a contiguous block of memory sufficient in size to store the entire compressed image data. By adding the special "LINK" sequence, the compressed image data can be fragmented to fit the memory fragments. Thus, when the decompressor encounters the "LINK" sequence, it knows that a physical address will follow. The physical address indicates where the next memory block starts. FIG. 2 shows how a compression scheme using the present invention allows "COMPRESSED IMAGE DATA" to be fragmented across memory.

Referring to FIG. 2, the decompressor receives the starting address of memory block 201. After decompressing "COMPRES", a "LINK" sequence is encountered. The ADDR after the "LINK" sequence points the decompressor to the beginning of block 203 effectively skipping block 202. In block 203 the decompressor continues decorepressing "SED IMAGE D". Again, the decompressor encounters a "LINK" sequence followed by an address. The address causes the decompressor to skip block 204. Finally, when the decompressor reaches the end of block 205, a "LINK" sequence, which is followed by a "EOD", in encountered signaling the decompressor to stop. In the preferred embodiment, "EOD" is defined as an address of zero. As FIG. 2 shows the size of each block is independent as is its location in physical memory.

Next, lets look at how the compressor must create the fragmented data of FIG. 2. Using the example of FIGS. 1 and 2, the compressor first estimates the size of the compressed data. Unless the compressor has foreknowledge about the incoming uncompressed data, the exact amount of storage necessary to store the compressed data is not known. Thus, the compressor makes an estimate based on heuristical or statistical data or it can assume a worst case. By allowing storage of the compressed data in non-contiguous memory, the compressor's original guess about the necessary storage requirements is less critical.

Figure 5:
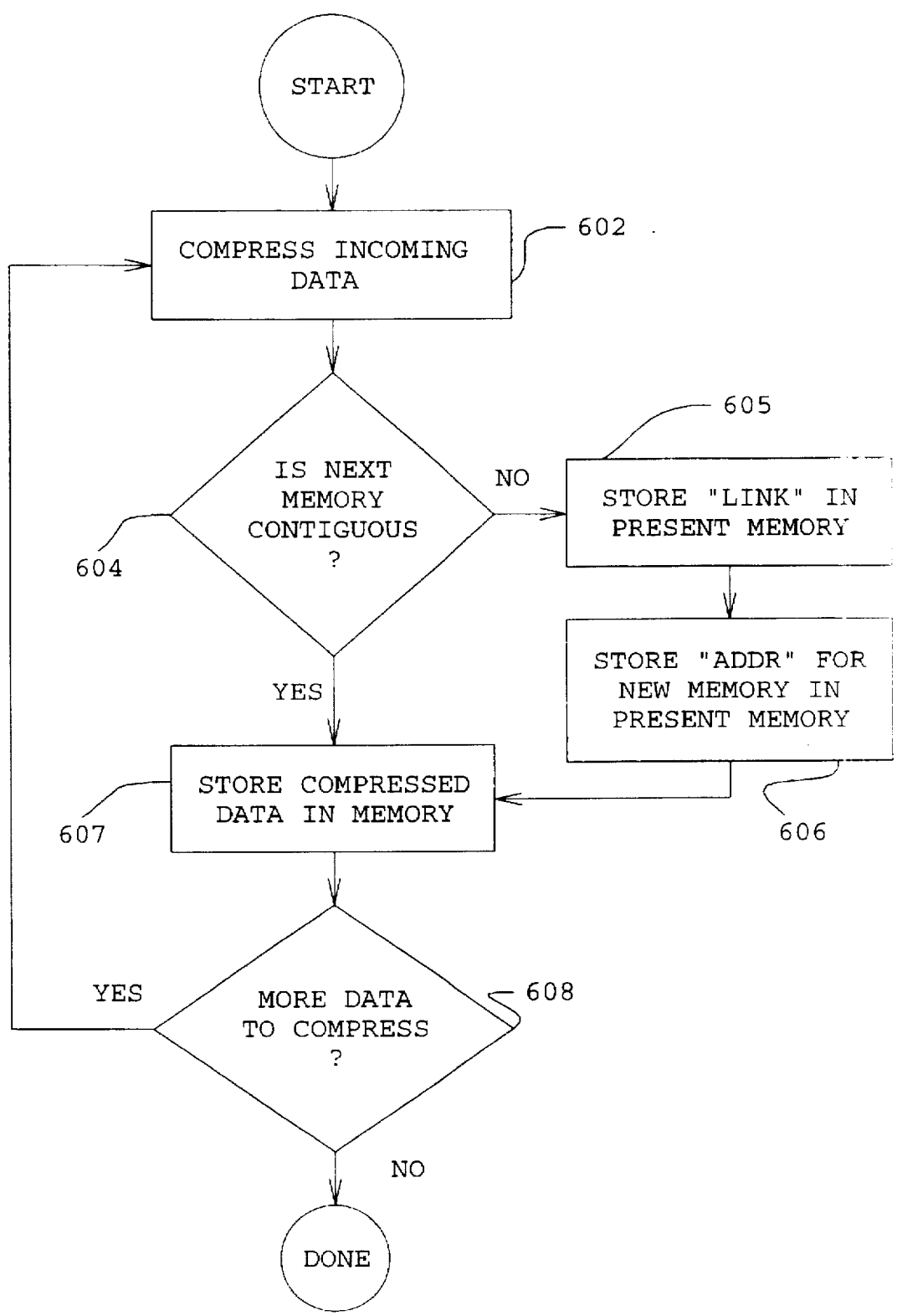
FIG. 5 is a flowchart showing a preferred embodiment data compression in accordance with the present invention.

Conceptually, the compressor performs two tasks. First it actually compresses the incoming data. Second, it links the compressed data if it is not stored in contiguous memory. A flowchart showing one possible embodiment of the compressor is shown in FIG. 5. In FIG. 5, the compressor compresses the incoming data 602. Next, it determines if the memory is contiguous 604. If the memory is contiguous, then the compressed data is simply stored 607. If, however, the memory is not contiguous, then the compressor inserts the "LINK" sequence 605 and the appropriate address 606 as shown in FIG. 2. The process continues 608 until all the incoming data has been compressed.

Under one embodiment, the compressor, based on its estimate, requests enough memory to store the compressed data. Assuming that enough memory is available, the memory management unit (MMU) grants the request. As part of the grant, the memory management unit informs the compressor the exact memory structure. Using the memory structure from the memory management unit, the compressor then steps through memory as it compresses the data. Upon completion, the compressor then sends back to the MMU the last memory addressed used. Finally, the MMU deallocates the unused memory.

Under an alternative embodiment, the compressor first asks for a small block of memory. Additional requests are issued as needed. When the compressor receives a new block, it first checks to see if it is contiguous with the last block. If the new block is not contiguous, then the appropriate "LINK" sequence and jump address are added to the end of the previous block. One skilled in the art of logic, will understand that given the above description of the memory structure, several alternative embodiments of the compressor are possible.

Figure 3:
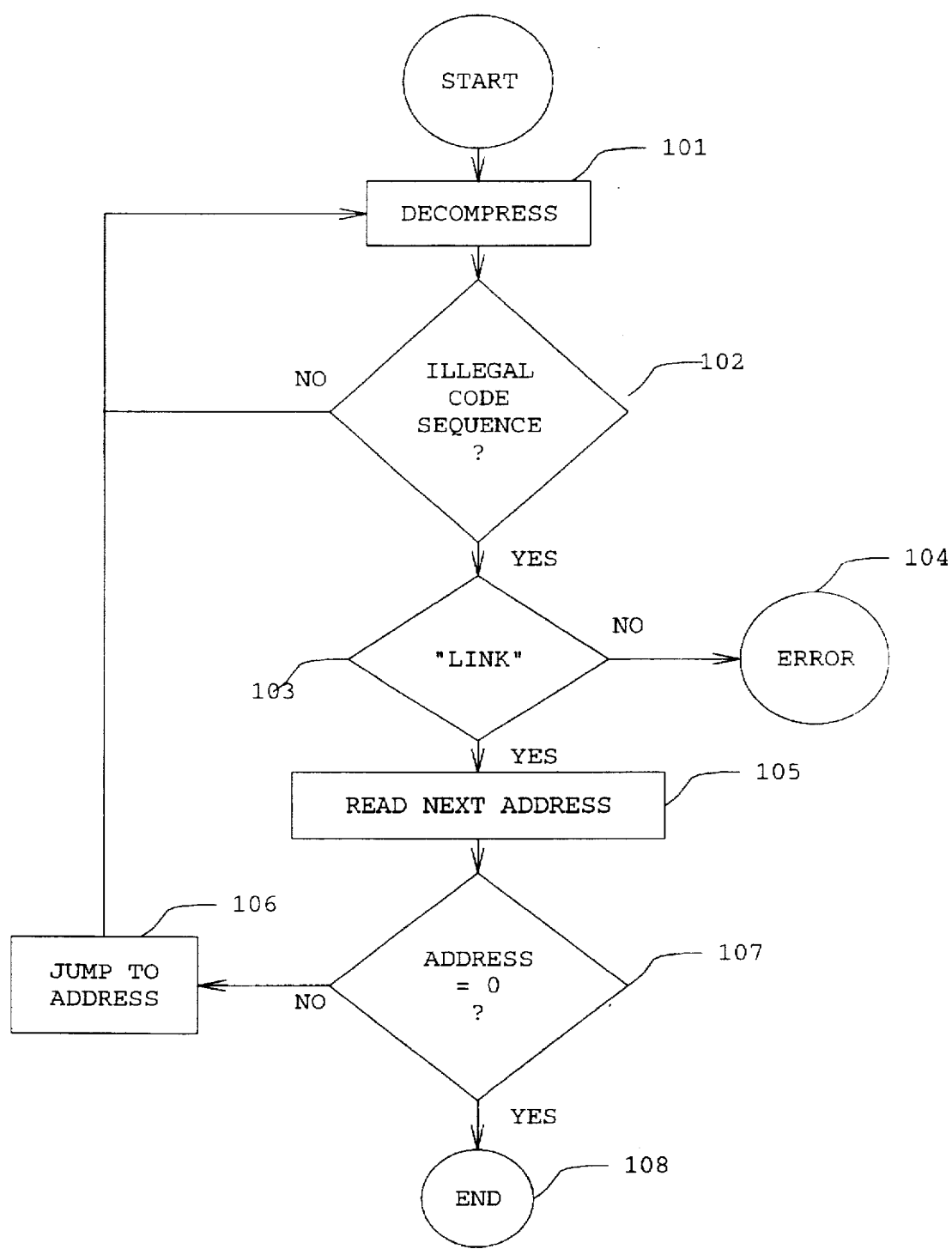
FIG. 3 is a flowchart showing a preferred embodiment for data decompression in accordance with the present invention.

Turning now to the de-compression requirements. A simplified flow chart as shown in FIG. 3 may aid the reader in better understanding the decompressor part of the present invention. The de-compressor (1408 of FIG. 4) starts decompressing the compressed data stored in memory 101 (1404 of FIG. 4). During the decompression, if the decompressor encounters an illegal sequence 102, the decompressor must determine 103 if this is an error condition 104 or an indication that an address follows. If the illegal sequence is two consecutive xFF ("LINK") the decompressor understands that the next location contains a pointer to where the remaining compressed data resides in memory. Thus, the de-compressor retrieves the next code 105. If that pointer is zero 107, then all the compressed data has been processed 108. If the address is non-zero, the decompressor jumps to the new address 106 and continues decompressing 101. One skilled in the art of logic will understand that the order as shown in FIG. 3 is only meant to show one possible arrangement.

Figure 4:
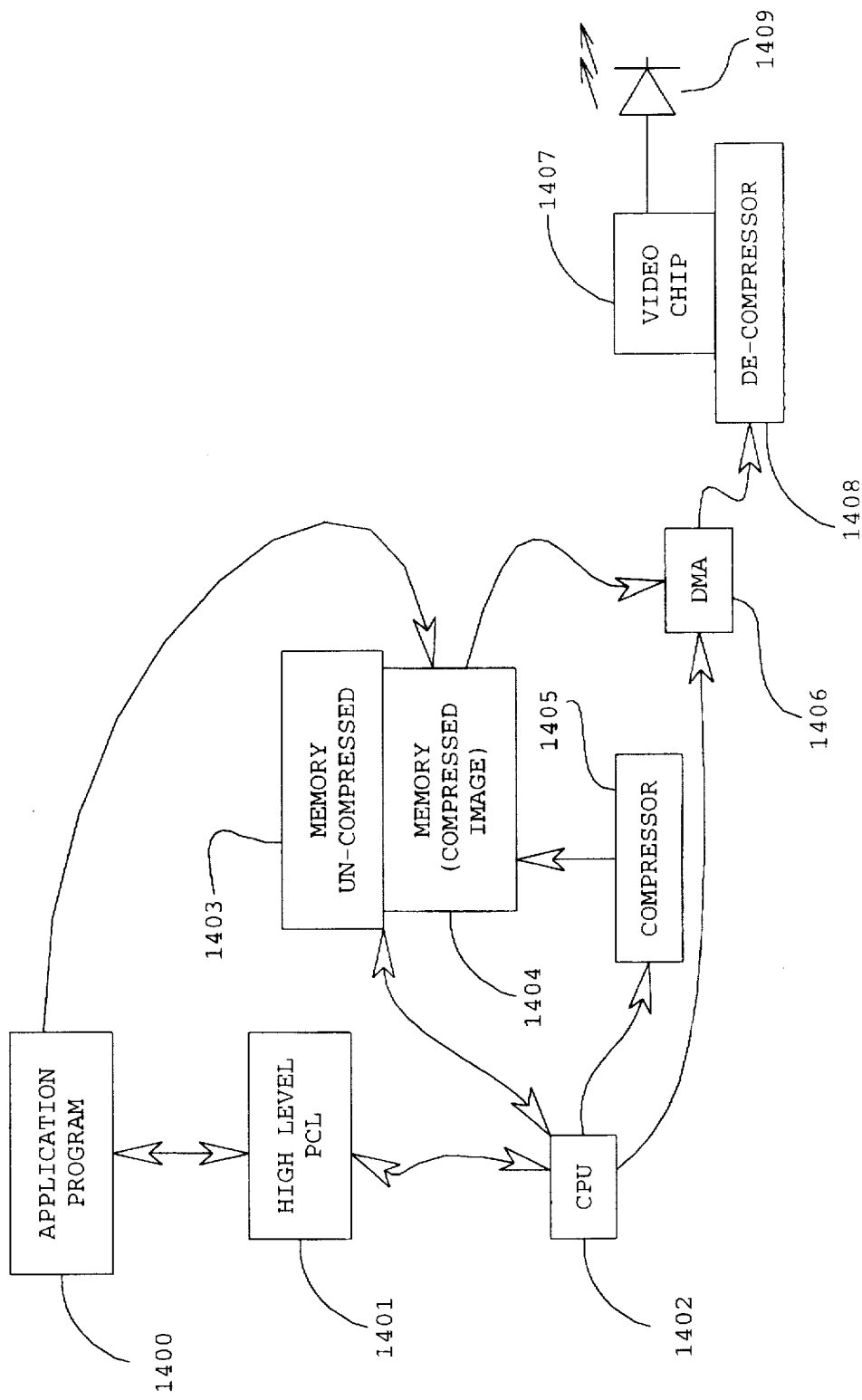
FIG. 4 is a high level functional diagram of a printer system that uses the present invention.

Referring to FIG. 4 where a generic block diagram of a printer is shown. Note that APPLICATION PROGRAM 1400 shown in FIG. 4 is not part of the printer system. While the data compression method can be used several ways with the block diagram of FIG. 4, two primary ways will be discussed here. Selection of a particular method is primarily determined by projected cost of the overall printer system.

With a more expensive implementation, CPU 1402 has sufficient processing power and memory to accomplish the compression algorithm itself. With a low cost printer system, CPU 1402 may not be present and memory requirements are kept to a minimum. With the inexpensive arrangement the application program 1400 must implement the compression algorithm.

With the high performance printer system, application program 1400 sends data to the printer system using a high level printer control language 1401. CPU 1402 retrieves the data from the high level printer control language 1401 and rasterizes that data in an uncompressed format into memory 1403. Next, the CPU retrieves the uncompressed rasterized information from 1403, passes it through compressor 1405, which then stores the compressed image back into memory 1404. At the appropriate time DMA 1406 under control of CPU 1402 retrieves the compressed image from memory 1404. The compressed image is then transferred to decompressor 1408, which performs the decompression algorithm. The output of decompressor 1408 is fed to video chip 1407 which modulates laser 1409 in accordance with the uncompressed image information.

Under the first arrangement, additional throughput between application program 1400 and the printer system can be accomplished by allowing the application program 1400 to compress the rasterized data prior to sending it to the printer system. Using the data compression method the application program can compress the information and then place it in the proper page description language prior to transmitting it to the high level PCL block 1401. When CPU 1402 retrieves the page description language instruction it will decode the instruction to mean that the following information is compressed data. Thus, CPU 1402 bypasses this step of compression and directly places the compressed data into compressed image memory 1404. As before DMA 1406 again retrieves the compressed image from 1404 transmitting it to decompressor 1408 which decompresses it and passes it onto video chip 1407 and laser diode 1409.

The second arrangement is an effort to minimize the cost of the printer system itself. Such an arrangement uses only blocks 1404, DMA 1406, decompressor 1408, video chip 1407 and laser diode 1409. Because the printer system does not contain a CPU, application program 1400 must implement the compression half of the algorithm.

In the normal printing process, DMA 1406 retrieves the compressed image from memory 1404 and, as before, feeds it to decompressor 1408 which decompresses the compressed image. This arrangement may significantly reduce the cost of the printer system since CPU 1402 is no longer necessary. However, such an arrangement does place an additional burden on application program 1400 to rasterize and compress the image.

Although the preferred embodiment of the invention has been illustrated, and that form described, it is readily apparent to those skilled in the art that various modifications may be made therein without departing from the spirit of the invention or from the scope of the appended claims.

What is claimed is:

1. A method for storing data in non-contiguous memory, said method comprising the steps of:

compressing original data by an arithmetic compression means into a compressed data;

writing a portion of said compressed data in a block of said non-contiguous memory;

causing said compression means to store in a link sequence in said block of said non-contiguous memory after said portion of said compressed data; and saving an address pointing to a next block of said non-contiguous memory in said block of said non-contiguous memory after said link sequence.

2. The method of claim 1 wherein said link sequence is a series of at least two consecutive xFF bytes.

3. The method of claim 1 further comprising the steps of:

reading said block of said non-contiguous memory;

decompressing said portion of said compressed data from said block;

detecting an illegal sequence;

determining if said illegal sequence is said link sequence;

retrieving said address pointer from said block; and jumping to said next block.

4. The method of claim 3 further comprising the steps of:

stopping if said address pointer has a EOD value; and signaling an error if said step of determining determines that said illegal sequence is other than link sequence.

5. A method for storing data in non-contiguous memory, said method comprising the steps of:

compressing original data by an arithmetic compression means into a compressed data;

writing a portion of said compressed data in a block of said non-contiguous memory;

causing said compression means to store in a link sequence in said block of said non-contiguous memory after said portion of said compressed data;

saving an address pointing to a next block of said non-contiguous memory in said block of said non-contiguous memory after said link sequence;

reading said block of said non-contiguous memory;

decompressing said portion of said compressed data from said block;

detecting an illegal sequence;

determining if said illegal sequence is said link sequence;

retrieving said address pointer from said block; and jumping to said next block.

6. The method of claim 5 further comprising the steps of:

stopping if said address pointer has a EOD value; and signaling an error if said step of determining determines that said illegal sequence is other than link sequence.

7. The method of claim 5 wherein said link sequence is a series of at least two consecutive xFF bytes.

8. A method for retrieving compressed data stored in non-contiguous memory, said method comprising the steps of:

reading a block of said non-contiguous memory where said block stores a portion of said compressed data;

decompressing said portion of said compressed data from said block using arithmetic decoding means;

detecting an illegal sequence;

determining if said illegal sequence is a link sequence;

retrieving an address pointer from said block, said address pointer being store in said block just after said link sequence; and jumping to a next block of said non-contiguous memory.

9. The method of claim 8 further comprising the steps of:

stopping if said address pointer has a EOD value; and signaling an error if said step of determining determines that said illegal sequence is other than link sequence.

10. The method of claim 8 wherein said link sequence is a series of at least two consecutive xFF bytes.

* * * * *